(12) United States Patent
Bahlke et al.

(10) Patent No.: US 8,841,152 B2
(45) Date of Patent: Sep. 23, 2014

(54) METHOD OF LIFT-OFF PATTERNING THIN FILMS IN SITU EMPLOYING PHASE CHANGE RESISTS

(75) Inventors: Matthias Erhard Bahlke, Cambridge, MA (US); Marc A. Baldo, Lexington, MA (US); Hiroshi Antonio Mendoza, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 80 days.

(21) Appl. No.: 13/465,065

(22) Filed: May 7, 2012

(65) Prior Publication Data

US 2012/0295382 A1 Nov. 22, 2012

Related U.S. Application Data

(60) Provisional application No. 61/487,839, filed on May 19, 2011.

(51) Int. Cl.
| | |
|---|---|
| *H01L 21/00* | (2006.01) |
| *H01L 21/302* | (2006.01) |
| *H01L 21/461* | (2006.01) |
| *H01L 51/00* | (2006.01) |

(52) U.S. Cl.
CPC .................................. *H01L 51/0016* (2013.01)
USPC ...................... 438/39; 438/715; 257/E21.349

(58) Field of Classification Search
CPC ............ H01L 51/0016; H01L 51/0008; H01L 2251/558
USPC .......................... 438/39, 82, 715; 216/40, 73; 257/E21.349
See application file for complete search history.

(56) References Cited

U.S. PATENT DOCUMENTS

| | | | |
|---|---|---|---|
| 4,348,473 | A | 9/1982 | Okumura et al. |
| 4,535,023 | A | 8/1985 | Whitlock |
| 7,282,430 | B2 | 10/2007 | Karg et al. |
| 7,318,992 | B2 | 1/2008 | Kawana et al. |
| 7,435,353 | B2 | 10/2008 | Golovchenko et al. |
| 7,524,431 | B2 | 4/2009 | Branton et al. |

(Continued)

FOREIGN PATENT DOCUMENTS

| | | |
|---|---|---|
| DE | 4318663 C1 | 10/1994 |
| EP | 0233747 | 8/1987 |
| WO | 01-39986 A1 | 6/2001 |

OTHER PUBLICATIONS

IBM Tech. Disci. Bull. NA920675, "Selective Deposition with "Dry" Vaporizable Lift-Off Mask". vol. 35, Issue 1A, (Jun. 1, 1002), pp. 75-76.*

(Continued)

*Primary Examiner* — Caridad Everhart
(74) *Attorney, Agent, or Firm* — Sam Pasternack; MIT Technology Licensing Office

(57) ABSTRACT

Method for making a patterned thin film of an organic semiconductor. The method includes condensing a resist gas into a solid film onto a substrate cooled to a temperature below the condensation point of the resist gas. The condensed solid film is heated selectively with a patterned stamp to cause local direct sublimation from solid to vapor of selected portions of the solid film thereby creating a patterned resist film. An organic semiconductor film is coated on the patterned resist film and the patterned resist film is heated to cause it to sublime away and to lift off because of the phase change.

17 Claims, 13 Drawing Sheets

(56) References Cited

U.S. PATENT DOCUMENTS

| | | | |
|---|---|---|---|
| 7,608,857 B2 | 10/2009 | Fujimori et al. | |
| 7,759,609 B2 | 7/2010 | Asscher et al. | |
| 2001/0023052 A1* | 9/2001 | Koide | 430/397 |
| 2003/0224205 A1* | 12/2003 | Li et al. | 428/690 |
| 2005/0009231 A1* | 1/2005 | Karg et al. | 438/99 |
| 2006/0083946 A1* | 4/2006 | Lee et al. | 428/690 |
| 2009/0111281 A1 | 4/2009 | Bencher et al. | |
| 2009/0173716 A1* | 7/2009 | Branton et al. | 216/66 |
| 2010/0170563 A1* | 7/2010 | Xue | 136/255 |
| 2011/0111542 A1* | 5/2011 | Yee et al. | 438/35 |
| 2011/0171763 A1* | 7/2011 | Lee et al. | 438/28 |

OTHER PUBLICATIONS

IBM Tech. Disci. Bull. NA920675 (Jun. 1992) pp. 75-76.*

IBM Tech. Disci. Bull. vol. 20, No. 9,(Feb. 1978). pp. 3737-3738.*

The International Search report and Written Opinion issued in Connection with International Patent Application No. PCT/US2012/036870 mailed on Nov. 30, 2012.

Selective Deposition With "Dry" Vaporizable Lift-off Mask, IBM Technical Disclosure Bulletin, vol. 35, No. 1A, pp. 75-76, Jun. 1992.

Condensed Gas, In Situ Lithography, IBM Technical Disclosure Bulletin, vol. 20, No. 9, pp. 3737-3738, Feb. 1978.

* cited by examiner ns a single step must utilize solvents in
METHOD OF LIFT-OFF PATTERNING THIN FILMS IN SITU EMPLOYING PHASE CHANGE RESISTS This application claims priority to provisional application Ser. No. 61/487839 filed on May 19, 2011, the contents of which are incorporated herein by reference.

This invention was made with government support under Grant No, DE-SC00G1088, awarded by the Department of Energy. The government has certain rights in this invention.

BACKGROUND OF THE INVENTION

This invention relates to the patterning of metallic, insulator, and semiconductor thin films by controlled removal for use in large area electronics.

The production of large area electronic devices utilizing organic semiconductor films typically requires the spatial patterning of various materials over a large area substrate. These films must also possess precisely defined thicknesses to ensure device and system functionality. Large area electronics typically utilize non-semiconductor substrates such as glass, plastic, metal foil, or ceramic and may be rigid or flexible. Such electronic devices are utilized in a number of product applications, including displays, lighting components, photovoltaics, sensors, and identification tags. Displays may be utilized in a number of settings, including televisions, mobile phones, signage, cameras, computers, global positioning systems, and gaming devices. The organic semiconductor films and ail layers that are deposited above them cannot be patterned by photolithography, as common photosensitive resist materials and associated solvents used in conventional electronics that employ semiconductor substrates dissolve many of the organic semiconductors that are desirably utilized.

As a result, patterning methods other than photolithography must be utilized to manufacture devices which contain organic semiconductor materials. Many of these methods have undesirable traits, which result in high production costs, low device throughput, and low production yield. Additionally, some methods may be restrictive in their compatibility with some materials, resulting in the use of alternative materials which may have performance traits that are less desirable.

One method to manufacture devices which contain organic semiconductor materials employs the use of fine metal masks with physical vapor deposition. The large area mask must be aligned to the underlying substrate prior to each deposition, which reduces throughput. These masks may expand and contract during film deposition, resulting in misalignment of film layers between device components over the large area substrate. When large masks are used to process large substrates, they may sag under their own weight, resulting in device feature misalignment. Mask sagging may be reduced with a vertical mask geometry, but this process may require additional substrate handling and highly customized source delivery systems, increasing production costs and reducing production throughput. The masks must be cleaned and replaced periodically, increasing production costs and reducing machine uptime.

Another method to manufacture devices which contain organic semiconductor materials employs the use of printheads, which may selectively deposit material over a small area. Large area substrates may be selectively coated by scanning one or more printheads. The printheads serially scan the substrate, resulting in patterned films. The scanning process may be slow, reducing process throughput. Using multiple printheads may increase the deposition rate, but each printhead may differentially degrade in deposition performance, resulting in functional non-uniformities over the substrate area. Material delivery may be achieved by a number of methods all of which dissolve desirably patterned materials in a solvent. However, solvents may degrade performance if they contribute impurities that do not evaporate away from the substrate. If deposited in liquid form, the liquid may flow, resulting in deposition non-uniformities. Substrates that, have been patterned in a previous step to have physical wells or areas of surface energy to increase deposition uniformity have been utilized, but these methods may not be compatible with all substrates and require additional processing steps, which may increase manufacturing cost. Devices which require multiple patterned films which cannot be deposited through the printhead in a single step must utilize solvents in subsequent printing steps which will not dissolve the already patterned films. Such restrictions on solvent requirements may exclude the use of certain materials to be desirably patterned and may require the use of more expensive solvents, which may either degrade device performance or increase production cost. If deposited in solid form through local evaporation at the printhead, the printhead and substrate may have to dissipate a large amount of thermal energy, reducing production throughput and increasing cost. This process may also result in device performance that is inferior to devices fabricated by alternate means, such as fine metal masked physical vapor deposition, resulting in undesired performance traits. Alternative materials may be utilized that do not show a difference between the two production processes, but these materials may not result in end device performance that is superior to alternative patterning methods.

Another method to manufacture devices which contain organic semiconductor materials employs the use of materials that are uniformly pre-coated on a secondary substrate which are then selectively transferred to the production substrate by means of a localized energy beam, such as a laser, which induces local vaporization. The laser or optical steering components are scanned over the secondary substrate, resulting in patterned films. This process may also result in device performance that is inferior to devices fabricated by alternate means, such as fine metal masked physical vapor deposition, resulting in undesired product traits. Alternative materials may be utilized that do not show a difference between the two production processes, but these materials may not result in end device performance that is superior to alternative patterning methods. The scanning process may be slow, reducing process throughput. Using multiple lasers or steering components may increase the deposition rate, but each laser may differentially fluctuate in intensity, resulting in deposition non-uniformities and functional non-uniformities over the substrate area.

Another method to manufacture devices which contain organic semiconductor materials employs the use of patterned cylinders for selective deposition, such as offset lithography, rotogravure, and relief printing. A pre-patterned cylinder is inked with the desirably patterned material dissolved in a suitable solvent. The cylinder is rolled over the substrate, resulting large areas of patterned substrates. Cylinder transfer of inks requires the use of solvents, which may degrade performance if they contribute impurities that do not evaporate away from the substrate. On certain substrates, the deposited ink may flow, resulting in deposition non-uniformities. Substrates can have been patterned in a previous step to have physical wells or areas of surface energy to increase deposition uniformity, but these methods may not be compatible with all substrates and require additional processing steps, which may increase manufacturing cost. Devices which require multiple patterned films which cannot be deposited by the cylinder in a single step must utilize solvents in subsequent printing steps which will not dissolve the already patterned films. Such restrictions due to solvent requirements may exclude the use of certain materials to be desirably patterned and may require the use of more expensive solvents, which may either degrade device performance or increase production cost.

Another method to manufacture devices which contain organic semiconductor materials employs the use of specialized materials which may be dissolved and deposited using solvents but whose active material undergoes a photochemical reaction which renders the material insolvent to solvents used in subsequent processing steps. These specialized materials typically result in devices with performance traits that are inferior to devices formed by alternate means and materials, resulting in undesired product traits.

Another method to manufacture devices which contain organic semiconductor materials employs the use of lasers to selectively ablate material which has previously been blanket deposited through some other means. This method may leave undesirable residues on the substrate, contributing to reduced device performance.

U.S. Pat. No. 7,282,430 issued to Karg in 2007 discloses an arrangement for patterning materials for use in large area electronics. A functional material is liquefied under high pressure and temperature in a chamber. The liquid is ejected through a printhead controlled by, for instance, a piezo element. The ejected liquid solidifies on a substrate through freezing which is controlled to maintain a temperature lower than the temperature of the liquid in the printhead. The printhead or substrate is serially scanned, forming a pattern of solid material on the substrate. No solvents are utilized in this process. Unlike the instant invention, there is no resist material and no lift-off step in the process. The instant invention is subtractive, where material is selectively removed from the substrate unlike U.S. Pat. No. 7,282,430, which selectively adds material to the substrate. While both the instant invention and U.S. Pat. No. 7,282,430 employ phase change to result in selective patterning, U.S. Pat. No. 7,282,430 describes phase changes between liquid and solid, where the instant invention describes phase changes between vapor and solid phases.

In 1992, Cuomo disclosed a method to pattern films with a vaporizable mask ("Selective Deposition With "Dry" Vaporizable Lift-off Mask," IBM Technical Disclosure Bulletin, vol 35, No. 1A, pp. 75-76, June 1992). A condensable vapor of either water, acetone, or chlorobenzene is uniformly coated onto a substrate forming a lift-off mask. The mask is spatially patterned with a pulsed laser incident through a projection mask through selective ablation. The substrate and patterned mask is uniformly coated with a second material by sputtering or evaporation. The composite is warmed by any of a variety of means to lift off the mask and overlying material, transferring a pattern to the second material. Unlike the instant invention, spatial patterning is communicated by a pulsed laser incident through a projection mask. Projection masks do not remedy deficiencies related to time consuming alignment between a mask and the substrate. A lift-off mask comprised of water, acetone, or chlorobenzene will dissolve certain materials desirably used in large area electronic devices which utilize organic semiconductors and do not have utility in patterning elements of such devices.

In 1978, Johnson disclosed a method for in situ lithography ("Condensed Gas, In Situ Lithography," IBM Technical Disclosure Bulletin, vol 20, No. 9, pp. 3737-3738, February 1978). A condensable vapor is uniformly coated onto a wafer forming a condensed gas resist (CGR). The CGR is spatially patterned using local heat application from light beams (preferably lasers), electron beams, or microwaves which are absorbed by the wafer, or from lines on the wafer. The wafer and patterned CGR is uniformly coated with a second material. The temperature of the entire wafer is raised above the CGR boiling point, which serves to liquify the CGR from its solidified state, which is followed by boiling to remove both the CGR and the overlying material, transferring the pattern in the CGR to the second material. Unlike the instant invention, the process is intended for use with wafers. Semiconductor wafers may be strongly absorptive of light beams, providing a convenient means of selectively patterning the CGR. The instant invention applies to non-semiconductor substrates such as glass, plastic, metal foil, or ceramic which are suitable for large area electronic devices for use in applications where semiconductor substrates are too expensive for economically viable products. The process employs two phase changes for resist lift-off, solid to liquid and liquid to vapor, in contrast to the instant invention which employs a single phase change from solid to vapor for resist lift-off. Utilizing liquid boiling of the CGR diminishes the achievable resolution of the desirably patterned film since the liquid CGR will flow to some degree no matter how short the residence time the CGR exists as a liquid. In addition, utilizing liquid phase CGRs may increase residue formation on the substrate, increase liquid surface tension effects and increase waste products of the process.

U.S. Pat. No. 7,435,353 issued to Golovchenko in 2008 and U.S. Pat. No. 7,524,431 issued to Branton in 2009 describe processes to form high resolution patterned material layers on a structure. A vapor is condensed to a solid condensate layer on a surface of the structure and then selected nano-metrically patterned and nano-scale regions of the condensate layer are locally removed by directing electron beams at the selected regions, exposing the structure at the selected regions. A material layer is then deposited on top of the solid condensate layer and the exposed structure at the selected regions. The solid condensate layer and regions of the material layer that were deposited on the solid condensate layer are then removed, leaving a patterned material layer on the structure. The process is related to electron beam lithography, where nano-scale patterns are transferred to a resist for nano-scale electronic, mechanical and chemical devices. The process employs either one scanned electron beam or multiple energy beams to selectively pattern the condensate layer in contrast to the instant invention, which utilizes either a single laser beam, resistive heating from patterned line on the underlying substrate, or a stamp with raised features brought into thermal contact with the condensate layer. Due to the slow nature to electron beam scanning, the processes described in U.S. Pat. Nos. 7,435,353 and 7,524,431 are applicable to nano-scale features and patterns and are not readily scalable to larger feature sizes in excess of 5 micrometers in contrast to the instant invention, directed towards the manufacture of large area electronic devices with features in excess of 5 micrometers distributed over substrates with lateral dimensions from 100 to 3000 centimeters in length or width.

U.S. Pat. No. 7,759,609 issued to Asscher in 2010 describes a method for forming nano-patterns of a material on a substrate called buffer layer assisted laser patterning. A layered structure is formed on the substrate, this layered structure being in the form of spaced-apart regions of the substrate defined by the pattern to be formed, each region including a weakly physisorbed buffer layer and a layer of the material to be patterned on top of the buffer layer. A thermal process is then applied to the layered structure to remove the remaining buffer layer in said regions, and thus form a stable pattern of said material on the substrate resulting from the buffer layer assisted laser patterning. The method may utilize either positive or negative lithography. The patterning may be implemented using irradiation with a single uniform laser pulse via a standard mask used for optical lithography. The positive lithography process utilizes laser pulsed patterning of the composite of buffer (resist) and overlying material which is deposited via soft landing following laser ablation of the buffer layer, in contrast to the instant invention whereupon a patterned condensate resist is coated with uniform material which is subsequently removed. The negative lithography process utilizes pulsed laser radiation to pattern the buffer and utilizes laser ablation to lift off the buffer, in contrast to the instant intention which utilizes a thermal shock induced by temperature change to lift off the resist material. The negative lithography process described in U.S. Pat. No. 7,759,609 is suited for forming narrow lines of less than 30 nanometers, in contrast to the instant invention directed towards the manufacture of large area electronics with feature sizes greater than 5000 nanometers, German patent DE 4318663 C1 issued to Holdermann in 1994 describes a process to form patterned films. Water ice forms a solid layer on a semiconductor substrate and then regions of the water ice layer are exposed to localized heating through various means, removing the water ice at the selected regions. A desirably patterned film is formed by either plating or etching the regions not covered in water ice. The plating or etching is performed in a liquid solution maintained below 0 C, such that the water ice does not melt or vaporize. The solid water ice layer is then removed, leaving a patterned material layer on the structure. The process described in DE 4318663 C1 selectively etches or plates the desirably patterned material in contrast to the instant invention, which utilizes blanket deposition followed by a lift-off process step. The process described in DE 4318663 C1 utilizes water ice and may include water vapor and/or liquid water. The instant invention is directed towards the use of non-water condensate resists for the patterning of films comprised of materials which are sensitive and reactive to water to the degree that water is desirably limited to levels much less than 1 part per billion.

U.S. Pat. No. 4,535,023 issued to Whitlock in 1985 describes a process to pattern a target for x-ray lasing. A substrate is placed in a gaseous atmosphere of a second material held at a temperature below the condensation point of the second material, such that the second material forms a condensed film on the substrate. The film is selectively heated using masked light beams to vaporize areas of the condensed film. The condensed film is not removed but forms an active component of the laser. The process described in U.S. Pat. No. 4,535,023 is directed towards the fabrication of targets for x-ray lasing made out of, for instance, sodium and neon. In contrast, the instant invention is directed towards the fabrication of large area electronics containing organic semiconductor films. The process described in U.S. Pat. No. 4,535,023 utilizes a patterned condensed film as an active device component which is not followed by subsequent deposition steps, whereas in the instant invention the condensed film functions as a sacrificial layer to lift-off a subsequently uniformly deposited film.

European patent document EP 0233747 published by Woods in 1987 describes a process to apply a polymeric resist coating of high molecular weight to a substrate. The process exposes a substrate to a vapor of an anionically polymerizable monomer which then polymerizes on the substrate, which then can be useful as a resist coating in lithographic processes employing plasma or acid etching. The process described in EP 0233747 relates to polymerizable condensable materials, in contrast to the instant invention directed towards simple molecular or elemental materials which do not form polymers or undergo any chemical reactions following condensation on the substrate. The process described in EP 0233747 utilizes a patterned resist as a blocking layer for a selective etching process, whereas in the instant invention the condensed film functions as a sacrificial layer to lift-off a subsequently uniformly deposited film U.S. Pat. No. 4,348,473 issued to Okumura in 1982 relates to a method for the preparation of microelectronic device which comprises a series of process steps performed on a substrate in a single vacuum chamber. A substrate is coated with a monomer film which is subsequently polymerized following the exposure to a light or electron beam. The selectively polymerized film is then uniformly heated to vaporize the monomer regions; the patterned polymer is used as a resist during a subsequent etching step and removed thereafter. The process described in U.S. Pat. No. 4,348,473 is directed toward polymerizable resist materials, in contrast to the instant invention directed towards simple molecular or elemental materials which do not form polymers or undergo any chemical reactions following condensation on the substrate. The process described in U.S. Pat. No. 4,348,473 utilizes a patterned resist as a blocking layer for a selective etching process, whereas in the instant invention the condensed film functions as a sacrificial layer to lift off a subsequently uniformly deposited film.

SUMMARY OF THE INVENTION

The present invention overcomes the deficiencies of the aforementioned techniques by providing a method and apparatus for depositing patterned thin films for use in large area electronics which incorporate organic semiconductor films at low cost over large areas that offer good uniformity, thickness control, resolution, and high process throughput without being restrictive to the type of material to be patterned.

In one aspect, the invention is a process called phase change lithography wherein a resist film patterned by selective thermal transfer induced local sublimation. A second film which is to be patterned is uniformly coated above the patterned resist film. A second uniform thermal energy transfer sublimes the resist film, which additionally lifts off the second film, resulting in partial or complete image transfer. The process may be repeated for each film to be desirably patterned to transfer an image relative to features in the substrate. One or more patterned films serve as device components in an electronic device functioning as either an organic light emitting diode (OLED) used in a display, an OLED for general purpose lighting, an organic photovoltaic (OPV) device for light-energy conversion, a large area circuit comprised of organic thin film transistors for identification tags, or an electronic device or system with an encapsulant to protect the device or system from environmental exposure.

In particular, in one aspect, the method of the invention for making a patterned thin film of an organic semiconductor for use in an electrical device structure includes condensing a resist gas into a solid film onto a substrate selected from the group consisting of glass, metal foil, polymer foil or ceramic cooled to a temperature below the condensation point of the resist gas. The condensed solid film is selectively heated with a patterned stamp to cause local direct sublimation from solid to vapor of selected portions of the solid film thereby creating a patterned resist film with feature dimensions of five micrometers or larger. An organic semiconductor film is coated on the patterned resist film and the patterned resist film is heated to cause it to sublime away and to lift off because of the phase change.

DESCRIPTION OF THE PREFERRED EMBODIMENT

Resist materials which are suitable for phase change lithography include those that directly transition between solid and vapor by sublimation at temperature and pressure ranges that are suitable for use in chamber processing equipment typically used in large area electronic device manufacturing. These ranges include approximately 80 to 300 K in temperature and $10^{-8}$ and $10^3$ Torr in pressure. The resist material is desirably chemically inert to the materials that are desirably patterned and that exist on the substrate to be patterned. The resist material should also possess a sublimation temperature that is greater than 77 degrees Kelvin, such that the resist will condense on substrates cooled by liquid nitrogen, a common industrial process coolant.

Resist materials compatible with the instant invention include carbon dioxide, nitrous oxide (or dinitrogen monoxide), argon, xenon, hydrogen chloride, acetylene, hexafluoroethane, butane, ethanol, ammonia, sulfur dioxide, isobutane, ethylene, chloroform, formic acid, iodine, and uranium hexafluoride. These examples are illustrative and not restrictive. Other materials are also envisioned and may be used.

Phase change lithography utilizes resist materials which are not chemically reactive with the materials which are desirably patterned or any other materials on the substrate to be patterned. In particular, organic semiconductor films are typically reactive with water and most organic solvents; this reactivity precludes the use of photolithographic techniques to form patterns in them. As such, it is not contemplated to use water or other organic solvents commonly used in semiconductor processing as resist materials for phase change lithography.

Carbon dioxide is a prime example of a material that can be used in the described process. It has a triple point of 216 K and 3885 Torr and is chemically inert making it compatible with the aforementioned process parameters. It is inexpensive, readily available and has been used in a proof-of-concept investigation to pattern both organic and metallic thin films as seen in the example photographs.

Figure 1:
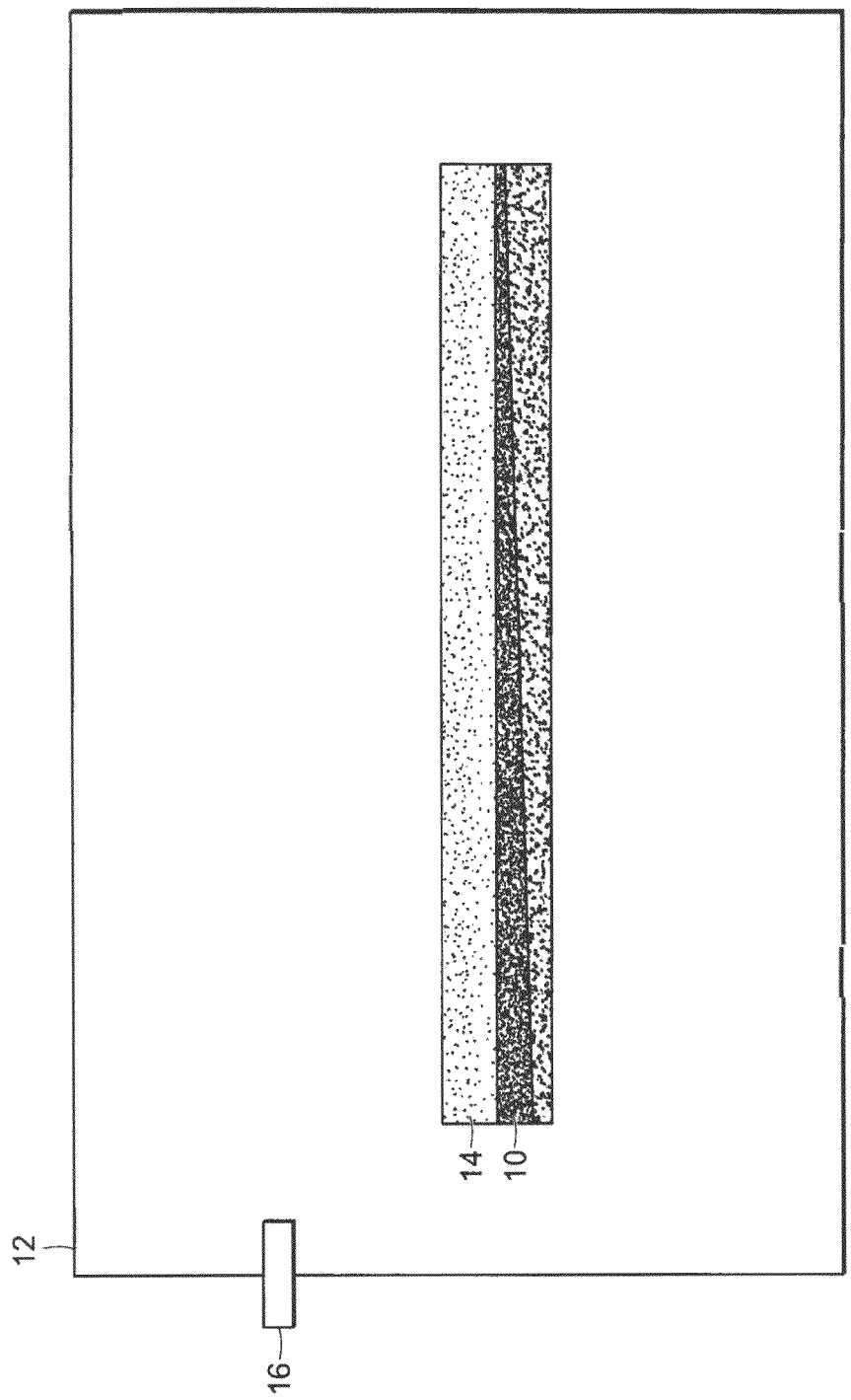
FIG. 1 is a schematic illustration of an embodiment of the invention disclosed herein.

With reference now to FIG. 1, a substrate 10 is cooled and resist gas is flowed into a chamber 12. The resist gas condenses on the substrate forming a solid layer 14. In particular, the resist is coated onto the substrate 10 through condensation. Prior to resist coating, the substrate 10 is cooled to a temperature below the condensation point of the resist gas. The substrate is exposed to a partial pressure of resist gas introduced to the condensation chamber 12 through a controlled method, such as a mass flow controller or bleed valve 16. Substrate 10 cooling may be achieved by thermal conduction via the structure that supports the substrate or to the whole condensation chamber 12, which is exposed to a cooled liquid, such as liquid nitrogen. As the resist gas encounters the cooled substrate 10 it condenses into the solid film 14 coating. The rate of condensation may be monitored by any convenient and suitable means, such as quartz crystal monitors, pressure monitoring, machine vision, or any combination of these methods.

The solid structure of the condensate resist affects patterning resolution, lift-off quality, and yield. Higher density resist films generally exhibit superior traits, and can be used to form patterns of higher resolution, result in patterned areas of more uniform thickness, and result in a patterned substrate with higher device yield. Some resist gases may condense in films with densities that are lower than desired, resulting in inferior patterning and resultant device traits.

Figure 2:
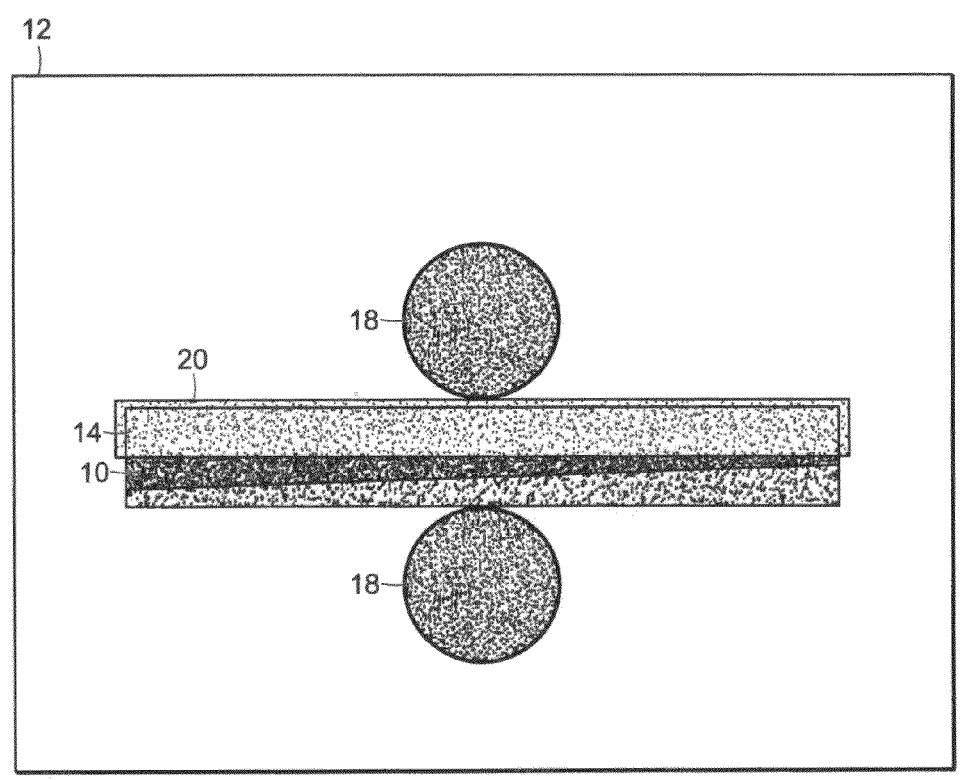
FIG. 2 is a schematic illustration of another embodiment of the invention in which rollers are used to compress the condensed resist gas.

As shown in FIG. 2, rollers 18 may be used to compress the resist gas. In one embodiment, the resist, is compacted subsequent, to condensation through the application of force. A large, cooled body 20, hereafter referred to as the compressor 20, with a uniform surface may be pressed into contact with the substrate 10, resulting in an applied force perpendicular to the film 14 thickness. This force may compress the resist film, increasing its density. The compressor 20 may be cooled to a temperature at or near the substrate 10 temperature to limit resist sublimation. The compressor may have a large, uniform face, such that it is brought into contact with the substrate to be patterned one time for each resist compression process step. Alternately, the compressor 20 may have a large area face which is smaller than the substrate to be patterned. The compressor compacts a partial area of the resist film and is then stepped until the whole of the to-be-patterned area is compressed. Alternatively, the compressor 20 may have a large curved area which is less than the area to be patterned such as a cylindrical roller, so that the curved area of the stamp is rolled over the substrate, such that contact between the compressor and the substrate is maintained over the full resist compression process. An additional support roller may be utilized to provide counterbalanced force to limit substrate flexing.

Material compression through perpendicular force of a material which is deposited by condensation is common in manufacturing, such as dry ice manufacturing. Carbon dioxide gas condenses on dry ice press in a form that resembles snow. A press rapidly oscillates to compress the snow into dense blocks or pellets, which serves to limit sublimation, increasing shelf life and facilitating transportation.

In one embodiment, the condensate resist 14 may be increased in temperature and pressure by following a predefined path through its temperature-pressure phase diagram such that is passes through a melting point, where the solid resist changes to a liquid resist. The material is then redirected through another predefined path through its temperature-pressure phase diagram such that is passes through a melting point, where the liquid resist changes to a solid resist. In this manner, the resulting solid resist film will have a higher density than the initial resist film deposited by condensation.

Figure 3:
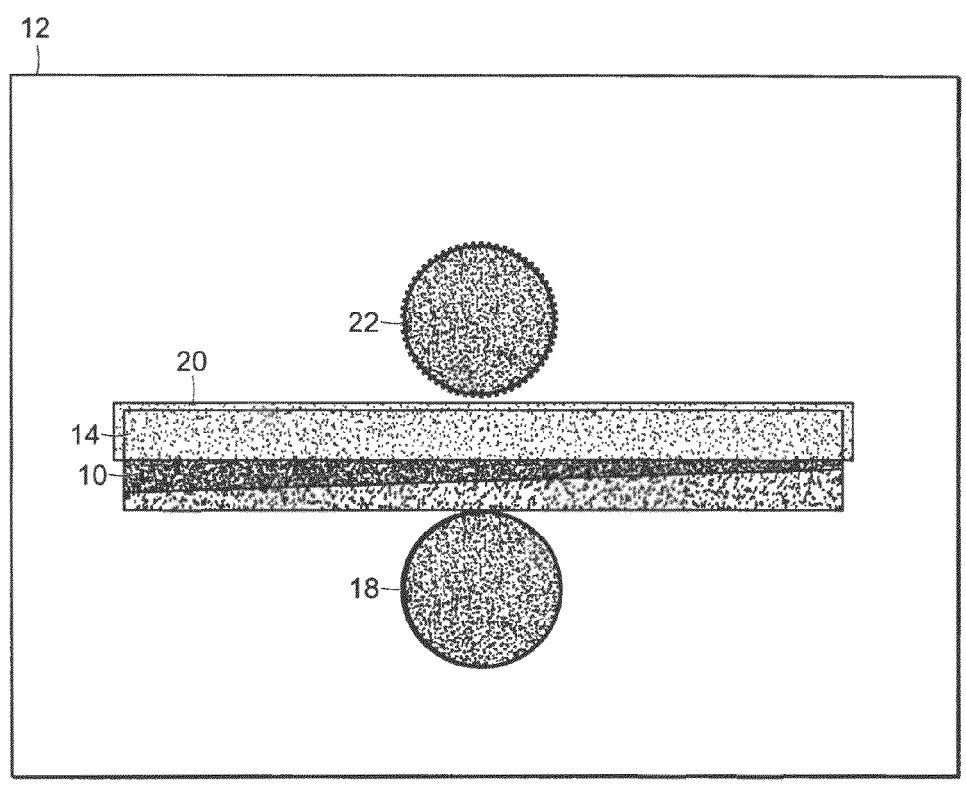
FIG. 3 is a schematic illustration of an embodiment of the invention using a microfeatured stamp/roller to define a desired pattern in a resist layer.

FIG. 3 shows a microfeatured stamp/roller 22 (top roller) that defines a desired pattern in the resist layer 14. For use in electronics, it is desirable that the patterned features have a controllable resolution to meet specifications for functionality and device density. Physical layout of insulating, conductive, and or semiconductor thin films dictate active device area, directly impacting overall performance metrics.

Condensate patterning is achieved through the transfer of features from a design to the film through selective thermal energy transfer. Thermal energy may be applied directly to the areas where full condensate removal is desired. Alternatively, thermal energy may be applied to an area larger or smaller than the area where full condensate removal is desired, since thermal energy may be transferred laterally through the substrate during or after the thermal power source is removed. The underlying substrate to be patterned may be uniform and unpatterned, or may possess features patterned by previous process steps.

Direct application of thermal energy may be applied by any convenient and suitable means, including those compatible with patterning of large substrates up to three meters in length or width. In all cases, thermal energy delivery is applied according to a desired layout relative to underlying features on the substrate. A number of patterning processes are compatible.

Figure 4B:
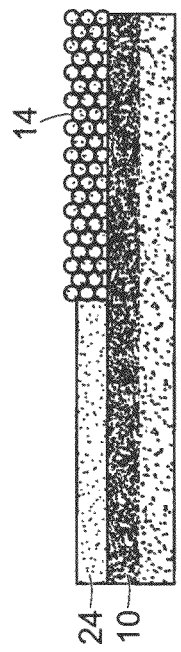
FIGS. 4A and B are schematic illustrations of an embodiment of the invention in which an electrical current selectively sublimes parts of the resist layer.
Figure 4A:
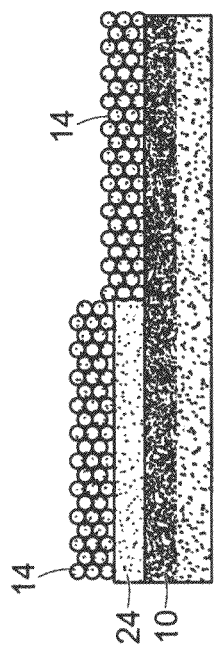

With reference to FIG. 4, current running through a transparent conducting oxide 24 on part of the substrate 10 (4A) heats up selectively subliming parts of the resist layer 14 (4B). In one embodiment, thermal energy is applied by joule heating of resistive elements in the underlying substrate. The resistive elements may be defined prior to condensation through any convenient and suitable means. For instance, electrodes for organic light emitting and organic photovoltaic diodes may be comprised of a transparent, doped tin oxide with features defined by photolithography. In organic light emitting and organic photovoltaic diodes, the organic thin films to be desirably patterned are deposited atop a substrate which already possesses patterned tin oxide electrodes. Resistive heating provides a convenient and suitable means to apply thermal energy, since resistive features are typically present in the substrate which is to be desirably selectively coated with an insulating or semiconducting film. Current flow through the resistive features may be temporally adjusted to directly control the amount of thermal energy transferred to the condensate film, resulting in the selective sublimation of condensate resist. Large area electronic systems may be comprised of many identical elements. For instance, an active matrix light emitting diode display deposited on a Generation 4 glass substrate may be comprised of several million each of identical red, green, and blue subpixels. Each of these subpixels require patterned layers of organic semiconductor thin films. Resistive heating is suited to this application, since large areas may be patterned in a two-dimensionally parallel process, facilitating high throughput patterning. Alternatively, the application of current may be applied serially, although the patterning throughput will decrease.

Figure 5A:
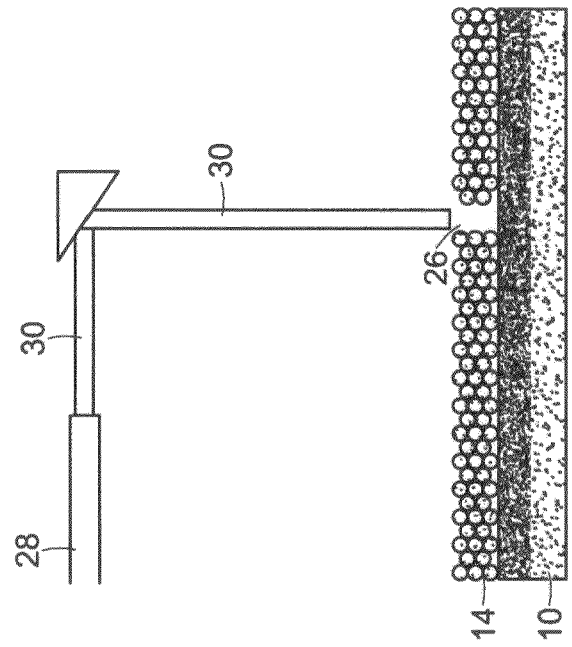
FIGS. 5A and B are schematic illustrations of an embodiment of the invention using optical patterning to selectively sublime parts of the resist layer.
Figure 5B:
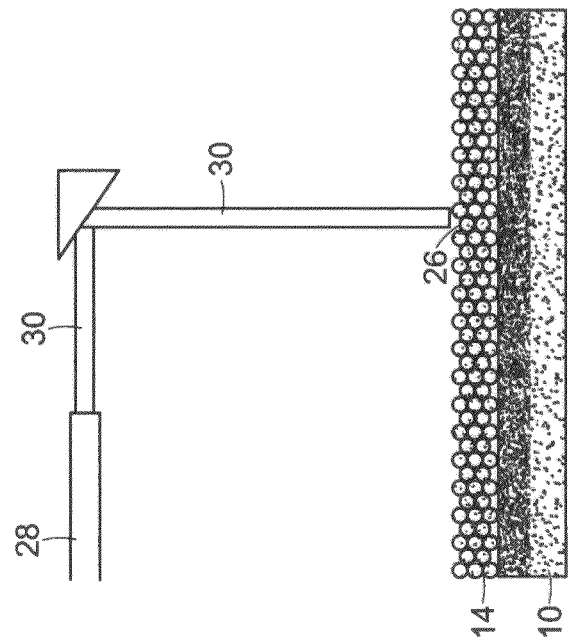

Optical patterning can also be used (FIG. 5A) to heat the film and selectively sublime parts 26 of the resist layer 14 (FIG. 5B). The optical patterning may be either a projected or scanning broadband or narrow-band light beam 30 (such as a laser) source 28. In another embodiment, thermal energy is delivered to the solid condensate resist through absorption of light energy delivered via a pulsed or continuous wave laser. Light absorption results in the promotion of free carriers to higher energy levels, which may convert the excited electrical state to thermal energy, which is transferred to the solid condensate resist and utilized for feature patterning by resist sublimation. For all materials of interest, absorption strength varies by wavelength according to underlying material properties. As such, the wavelength of laser excitation is chosen such that sufficient light absorption is achieved to result in resist sublimation. Correspondingly, the wavelength of laser excitation depends on the condensate resist material to be patterned. For instance, carbon dioxide is highly transparent throughout the visible spectrum. Light absorption is stronger in the ultraviolet and infrared spectra, so carbon dioxide may be patterned by lasers at approximately 255, 2700, or 4300 nanometers. For large area patterning, optical energy may be delivered serially via scanning the laser using rotatable optical elements. The laser used to transfer light energy to the solid condensate may be aligned to the substrate and existing features by any convenient and suitable method, including machine vision, and making reference to fiducials, or readily referenced features on the underlying substrate.

In another embodiment, thermal energy is delivered to the solid condensate resist through absorption of light energy by an optically dense guest material which is doped into the resist film during condensation. Light energy is delivered via a pulsed or continuous wave laser. The optically dense guest material is selected for the purpose of light absorption. The guest material is desirably a material which will not contaminate the electronic device. In one example, the guest material is chosen to be the same organic semiconductor which will be deposited onto the selectively patterned condensate resist. The wavelength of laser excitation and the doping ratio of guest material in the resist are chosen such that sufficient light absorption is achieved to result in resist sublimation. Correspondingly, the wavelength of laser excitation depends on the guest material. For instance, aluminum tris(quinolh-8-olate) (Alq3) strongly absorbs violet light at 400 nanometers. So a condensate resist doped with Alq3may be patterned with lasers with wavelengths in the range of 325 to 425 nanometers. The doping ratio of the guest material may be between 0.5% and 10% and is selected to adjust various process parameters such as patterning throughput and equipment parameters such as laser intensity. For large area patterning, optical energy may be delivered serially via scanning the laser using rotatable optical elements. The laser used to transfer light energy to the solid condensate may be aligned to the substrate and existing features by any convenient and suitable method, including machine vision, and making reference to fiducials, or readily referenced features on the underlying substrate.

In another embodiment, thermal energy is delivered to the solid condensate resist through absorption of light energy by the substrate, which is converted to thermal energy and conducted to the condensate resist. Light energy is delivered via a pulsed or continuous wave laser. The wavelength of laser excitation is chosen such that sufficient light absorption is achieved to result in resist sublimation. For large area patterning, optical energy may be delivered serially via scanning the laser using rotatable optical elements. The laser used to transfer light energy to the solid condensate may be aligned to the substrate and existing features by any convenient and suitable method, including machine vision, and making reference to fiducials, or readily referenced features on the underlying substrate.

Figure 6A:
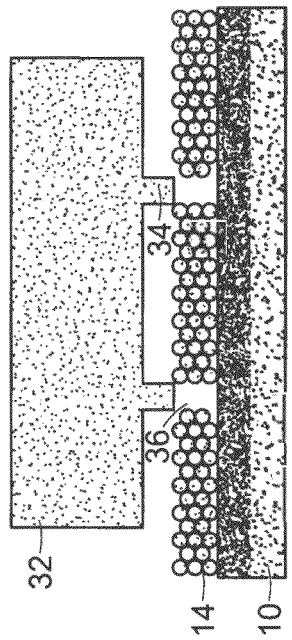
FIGS. 6A and B are schematic illustrations of an embodiment of the invention utilizing a microfeatured stamp to define parts of the resist mask.
Figure 6B:
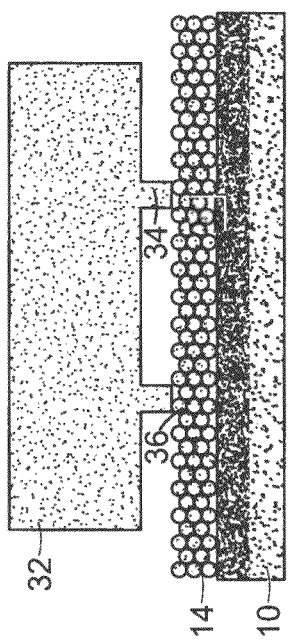

A microfeatured stamp 32 (FIG. 6A) defines parts of the resist mask by raised portions 34 coming in contact with and subliming away parts 36 of the mask (FIG. 6B). In this embodiment, thermal energy is transferred through the direct or proximal contact with body with a temperature higher than the condensate resist. The body, hereafter referred to as the stamp 32, has patterned features, providing a means to selectively transfer thermal energy and thus selectively sublime the resist 36. The stamp may have two dimensional raised features distributed over a large flat area, such that it is brought into contact with the substrate to be patterned one time for each resist patterning process step. Alternatively, the stamp 32 may have two dimensional raised features distributed over a large flat area which is less than the area of the substrate 10 to be patterned, such that the stamp 32 is brought into contact with the substrate to be patterned several times for each resist patterning step, where the stamp is translated between each contact process. Alternatively, the stamp 32 may have two dimensional raised features distributed over a large curved area which is less than the area to be patterned such as a cylindrical roller, so that the curved area of the stamp is rolled over the substrate, such that contact between the stamp and the substrate is maintained over the full condensate resist patterning process. An additional support roller may be utilized to provide counterbalancing force to limit substrate flexing.

The stamp 32 can be patterned by any convenient, and suitable means and is reused over many patterning processes. As a result, patterning methods which are slow, expensive, and high resolution may be utilized, such as chemical etching through a photolithographically defined resist, mechanical scribing with a diamond stylus, direct laser ablation, or any other convenient and suitable means. The stamp should have raised features of a height equal to or greater than the thickness of the solid condensate, such that only the raised features come into direct or proximal contact with the substrate to be patterned in a desired way. Full image transfer may be utilized by using a stamp with raised features in direct correspondence to the desirably patterned film features. Alternatively, incomplete image transfer may be utilized by using a stamp with raised features that do not fully correspond to the desirably patterned film features, such that, inconsistencies in thermal energy transfer are accounted for to result in the patterned film with dimensions true to designer intent. The relative coverage of the raised features on the stamp may be in a majority or a minority compared to the total stamp area, depending on desired film duty cycle. The raised features may be bounded, such that they are surrounded by lowered features. Alternatively, they may not be bounded, such that the raised features may extend to the edges of the stamping face. The aspect ratio, or ratio of width or length to the height of the raised features may cover a range from 0.1 to 10. The stamp may be comprised of any convenient and suitable material. For high throughput patterning, the stamp should be comprised wholly or partially of high thermal conductivity materials, such as metals, and specifically copper, stainless steel, chromium, or aluminum. For dimensional stability, stainless steel or one of its alloys may be utilized. For mechanical durability, the raised features may be additionally coated with a thermally conductive layer with high durability such as chromium, such that the stamp can be reused for many patterning processes.

In particular, stamps may be of the form similar to those used for rotogravure printing. In one method, cylindrical rollers used in rotogravure are patterned using a pulsed Nd:yttrium aluminum garnet laser of up to 500 watts in intensity to ablate the roller surface. The beam diameter, pulse duty cycle, and beam profile of the laser is modified to control the shape of the raised features. For rotogravure, raised features may be minimum lengths and widths of 5 micrometers and typical heights of 1 to 40 micrometers. Aspect ratios of raised features may be approximately 2. The cylindrical roller for rotogravure may have lengths up to 5 meters, weigh up to 2000 kilograms and spin at up to 40 revolutions per second during laser patterning, such that the cylinder is moving at a rate greater than the laser. Unlike rotogravure printing, the stamp used for patterning thin films is not filled with ink, so the dimensions of the raised features may be dissimilar, in particular, their aspect ratio and height. Rotogravure cylinders may be periodically de-plated and re-patterned to ensure patterning fidelity.

The stamp used to transfer thermal energy to the solid condensate may be aligned to the substrate and existing features by any convenient and suitable method, including machine vision, and making reference to fiducials, or readily referenced features on the underlying substrate.

The substrate may be actively and uniformly cooled during condensate resist patterning, such that temperature control and dimensional stability are maintained and to provide a counterbalancing thermal sink to limit total thermal power transfer to the condensate resist. In order to limit resublimation of patterned or unpatterned areas of condensate resist, the substrate may be cooled to a temperature during the patterning process which is lower than that for condensation and compression processes. This lower temperature may be delivered, for instance, through connection to cryostages cooled by open or closed cycle helium. Depending on process speed, temperature, and pressure, it may be preferred that the deposition chamber walls are also cooled and thus coated with condensate resist to maintain substrate resist integrity by reducing redeposition of sublimed resist and to aid the cleaning of the chamber walls. Alternatively, an additional large surface area cooled element could be integrated to prevent sublimed resist redeposition.

Solid condensate resist patterning may occur in a variety of environments, including inert gases such as nitrogen or argon, or in vacuo. The environment may also include a partial atmosphere of a gas which is the vapor form of the condensate resist in order to equilibrate between sublimation and condensation to maintain desired features in the resist. The low temperature of the substrate may result in the undesirable condensation of gases other than the resist material, so the environment may be preferably absent of such impurities, such that levels or concentrations of these gases are well below 1 part per billion. In particular, water vapor may be desirable limited well below 1 part per billion.

In one embodiment, the patterning process is utilized to define metals or organic semiconductor thin films for use in OLED displays. A typical feature dimension for organic pixels or sub-pixels for use in this application is approximately 10 micrometers to 250 micrometers in length and width and 1 to 200 nanometers in thickness. A typical feature dimension for metallic electrodes, interconnections, or busing for use in this application is approximately 10 micrometers to 100 centimeters in length and width 1 to 500 nanometers in thickness.

As such, the features which are desirably transferred to the condensate resist may have dimensions in the same range.

In one embodiment, the pattering process is utilized to define metals or organic semiconductor thin films for use in OLED lighting components. A typical feature dimension for organic pixels or sub-pixels for use in this application is approximately 0.5 to 1000 centimeters in length and width 1 to 200 nanometers in thickness. A typical feature dimension for metallic electrodes, interconnections, or busing for use in this application is approximately 10 micrometers to 1000 centimeters in length and width and 1 to 500 nanometers in thickness. As such, the features which are desirably transferred to the condensate resist may have dimensions in the same range.

In one embodiment, the patterning process is utilized to define metals or organic semiconductor thin films for use in organic photovoltaic arrays. A typical feature dimension for organic pixels or sub-pixels for use in this application is approximately 0.5 to 1000 centimeters in length and width 1 to 200 nanometers in thickness. A typical feature dimension for metallic electrodes, interconnections, or busing for use in this application is approximately 10 micrometers to 1000 centimeters in length and width and 1 to 500 nanometers in thickness. As such, the features which are desirably transferred to the condensate resist may have dimensions in the same range.

In one embodiment, the patterning process is utilized to define insulating thin films for use as encapsulants. A typical feature dimension for insulating layers for use in this application is approximately 0.1 to 1000 millimeters in length and width and 1 to 100 micrometers in thickness. As such, the features which are desirably transferred to the condensate resist may have dimensions in the same range.

Figures 7A, 7B:
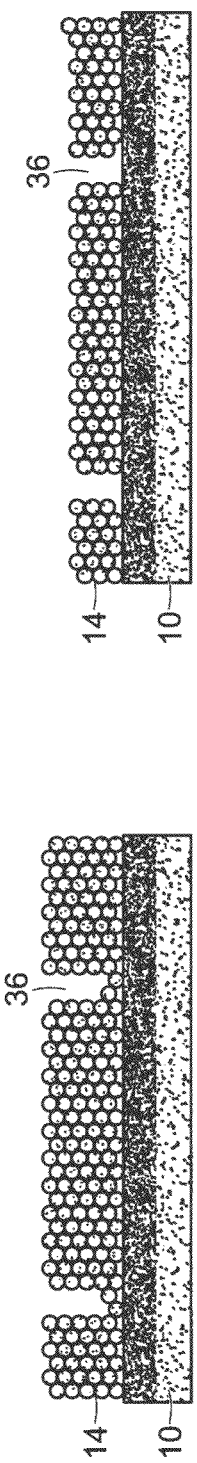
FIGS. 7A and B are schematic illustrations showing partial-depth stamping leaving a uniform thickness burn-off to remove the remainder of desired regions.

With reference to FIG. 7, partial-depth stamping leaves a uniform thickness burn-off to remove the remainder of the desired regions. Before burn-off is shown in FIG. 7A and after burn-off is shown in FIG. 7B. In this embodiment, the selective sublimation of solid condensate resist is followed by a uniform sublimation process. An energy source that is uniform in nature sublimes a fractional thickness of the solid condensate resist. This uniform sublimation serves to ensure any desirably patterned condensate that experienced incomplete sublimation may be completed. The uniform sublimation will also remove the condensate resist from regions that are desirably maintained. Because of this, the fraction of the total condensate resist thickness that is removed does not exceed 50 percent. The uniform energy source for uniform sublimation may include exposure to an element at an elevated temperature, including the substrate support stage where energy may be transferred by conduction, a uniform optical source where energy may be transferred by radiation, a thermal point source which may radiate thermal energy, or any convenient and suitable combination of the preceding.

A substrate with a selectively patterned condensate resist layer may be utilized to transfer the pattern to a subsequently deposited film of conductor, insulator, or semiconductor material. The desirably patterned film is deposited uniformly over the patterned condensate resist.

Figure 8:
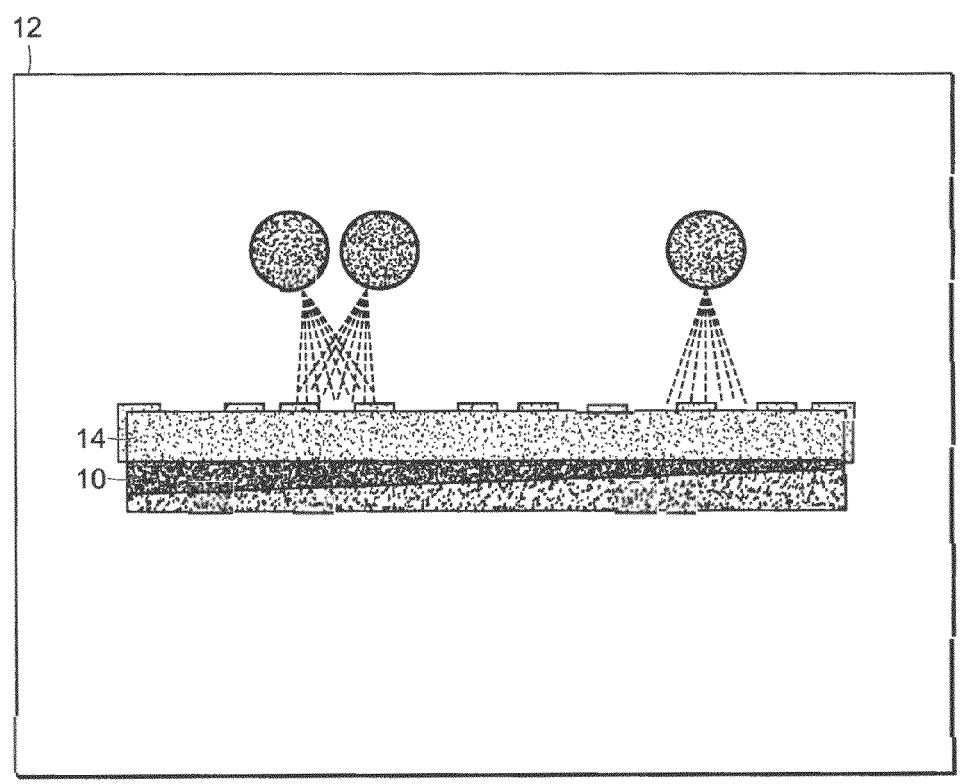
FIG. 8 is a schematic illustration of an embodiment of the invention showing co-deposition of materials.

FIG. 8 shows codeposition of materials (left) and deposition of a single material (right) on to a substrate with a defined sublimable mask. The desirably patterned film may be patterned by any convenient and suitable means, including thermal evaporation, sputtering, chemical vapor deposition, plasma deposition, or physical vapor deposition. Uniform deposition may occur in a variety of environments, including inert gases such as nitrogen or argon, or in vacuo. The environment may also include a partial atmosphere of a gas which is the vapor form of the condensate resist in order to equilibrate between sublimation and condensation to maintain desired features in the resist. The low temperature of the substrate may result in the undesirable condensation of gases other than the resist material, so the environment may be preferably absent of impurities, such that levels or concentrations of these gases are well below 1 part per billion. In particular, water vapor may be desirably be limited well below 1 part per billion.

Some methods of film deposition the utilization of a hot source. For instance, thermal evaporation utilizes a hot source boat which vaporizes a solid or liquid source material. The hot boat may transfer thermal energy to the substrate by conduction or radiation, which may be undesirably sublime the condensate resist partially or entirely. In one embodiment, thermal baffles may be utilized in the deposition chamber resist. The thermal baffles utilized to block thermal transfer may be comprised of any convenient and suitable materials, including metals which are thermally connected heat sinks. In order to limit resublimation of patterned areas of condensate resist, the substrate may be cooled to a temperature during the deposition process which is lower than that for condensation and compression processes. This lower temperature may be delivered, for instance, through connection to cryostages cooled by open or closed cycle helium.

In some instances, uniform sublimation of the condensate resist may occur during the uniform disposition of the desirably patterned film. In these cases, total resist sublimation is limited to less than 50% of the total resist thickness in order to ensure high device yield.

The geometric layout of the source may be any which is convenient and suitable, including linear, point, or continuous. The deposition direction may be vertical or horizontal and may occur on top or bottom of the substrate. Simultaneous co-deposition of two or more source materials is contemplated as well. The deposition may take place in one or more chambers.

A variety of materials may be deposited depending on the device which is being manufactured. The current invention is not meant to be limited to use with certain materials. Some thin film device components which may be deposited with the described processes include electron and hole transport layers for OLED displays or lighting components, emitting materials for OLED displays or lighting components, device electrodes or OLED displays or lighting components, interconnects and busbars for OLED displays or lighting components, n-and p-type materials for organic photovoltaic devices, device electrodes for OPV, interconnects and busbars for OPV, and insulating thin films for encapsulants.

Figures 9A, 9B:
FIGS. 9A and B are schematic illustrations showing patterning of a material by subliming an underlying resist mask.
Figure 10:
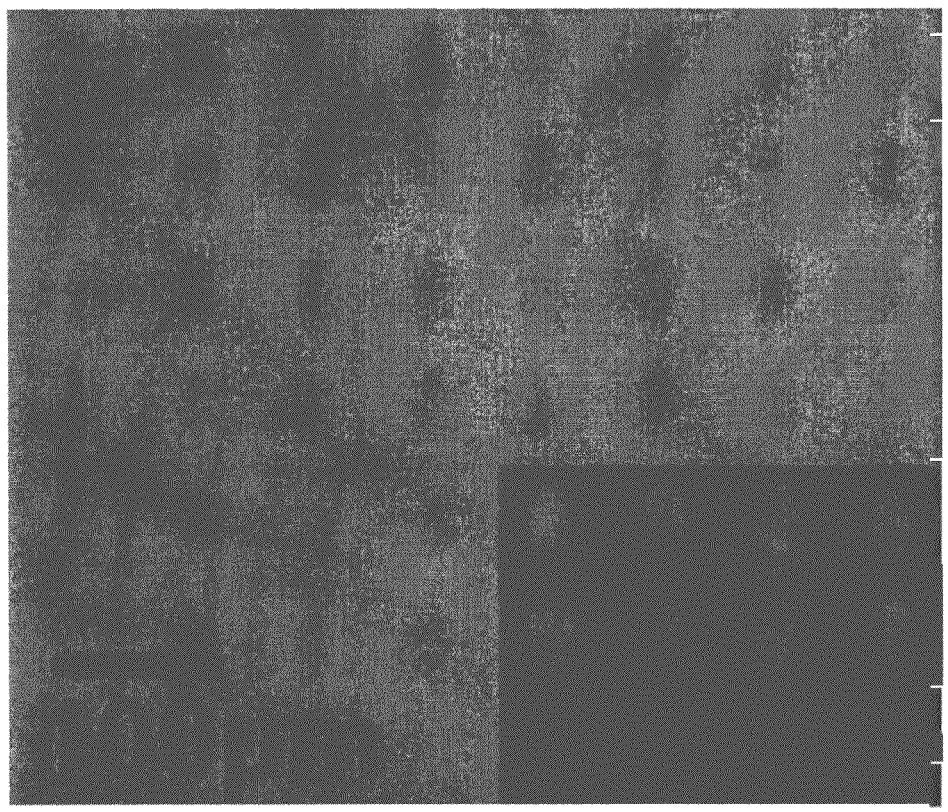
FIG. 10 is an optical micrograph of a patterned sublimable mask of carbon dioxide according to the invention.
Figure 11:
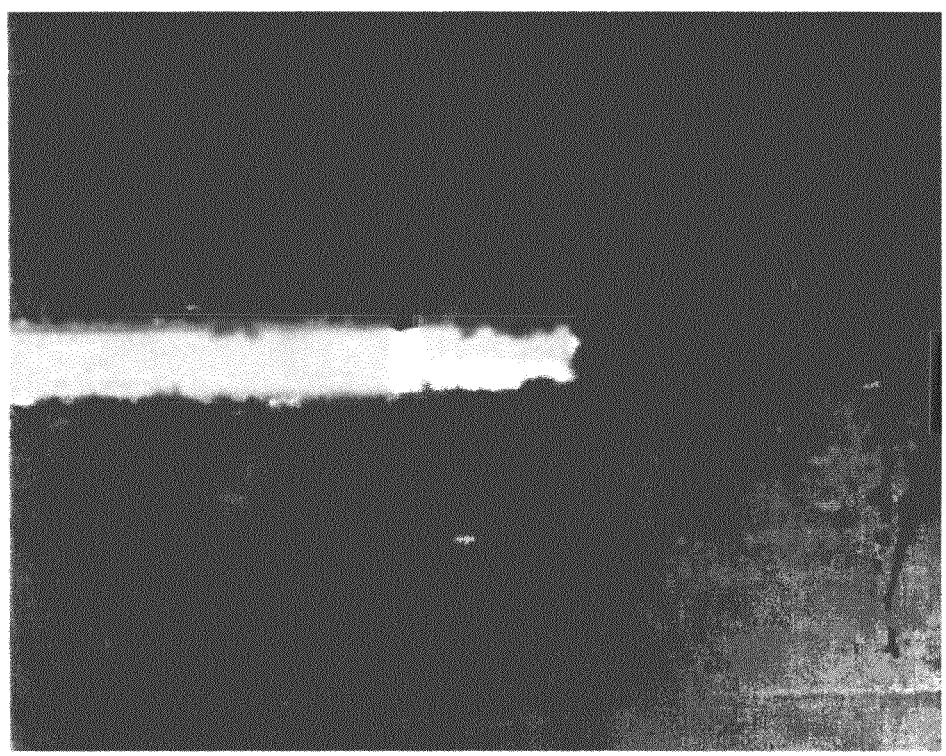
FIG. 11 is an optical micrograph of a 100 μm-wide silver line patterned using a sublimable carbon dioxide mask.
Figure 12:
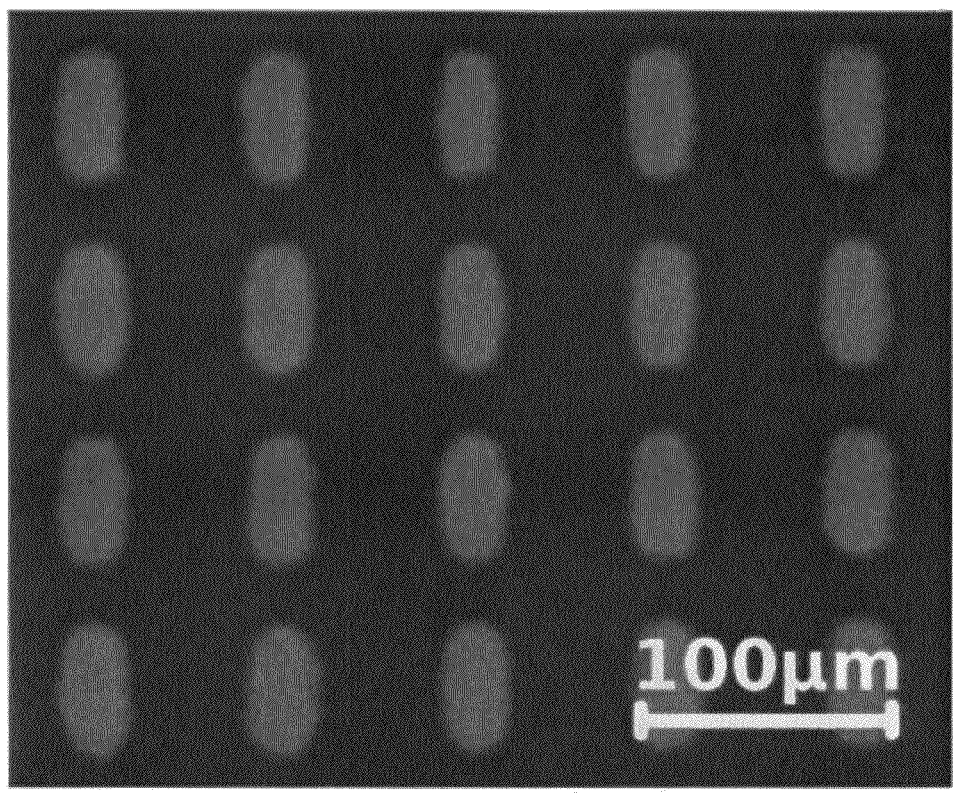
FIG. 12 is an optical micrograph of an array of 20 μm by 50 μm subpixals of Alq3 produced by stamping a sublimable mask of carbon dioxide.
Figure 13:
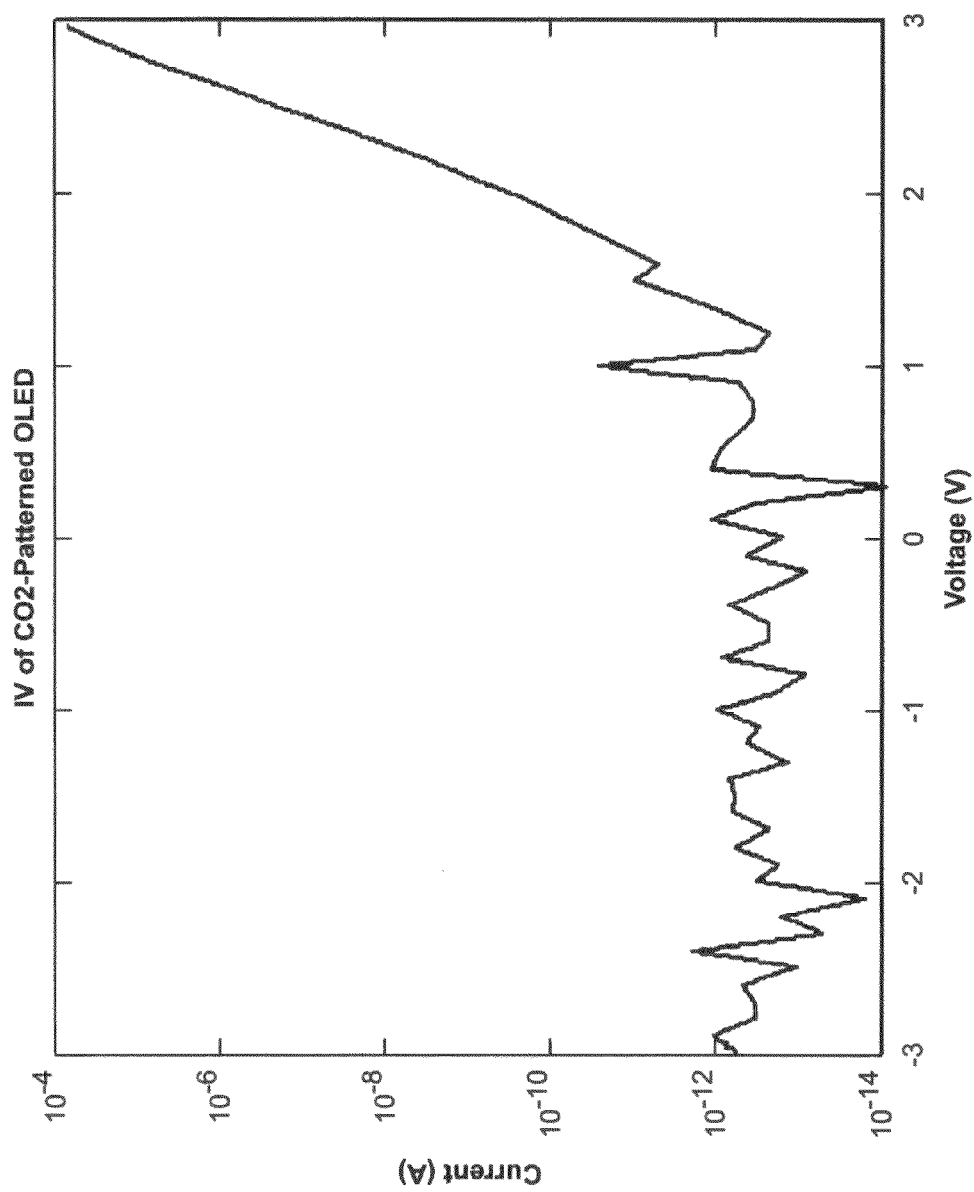
FIG. 13 is a graph showing the electrical characteristic of a functional organic light emitting diode fabricated using a carbon dioxide sublimable mask in accordance with the invention.

FIG. 9 shows patterning of a material by subliming the underlying resist mask 40. The portions of the film on top of the masked regions (FIG. 9A) are removed along with the resist material leaving behind the patterned thin film 42 (FIG. 9B). To transfer the pattern in the condensate resist to the desirably patterned film, the condensate resist is lifted off. The direct solid to vapor sublimation of the condensate resist lifts off the solid base which supports a portion of the desirably patterned film, such that it is removed from the substrate during resist lift-off.

Resist lift-off is effected by increasing the temperature of the condensate resist across its sublimation point in pressure-temperature space. This movement in pressure-temperature space may be affected by an increase in temperature, a change in pressure, or a combination of both. Uniform resist lift-off may be achieved by any convenient and suitable means, including exposure to hot gas, thermal heating conducted through the substrate support, or thermal energy radiated by a distant localized source,, such as, for instance, a hot filament. The change in pressure or temperature may be temporally constant or follow a defined profile. The quality of pattern transfer is observed to increase when thermal heating is applied from the substrate, such as from a heating element conducted through the substrate support.

It is preferred that the condensate resist layer be removed by, as well as formed by, solid to vapor and vapor to solid processes, respectively. Such enables an entirely dry deposition and removal cycle that does not require liquids, limiting the need for solvent disposal.

The quality of pattern transfer from condensate resist to film is increased when sublimation is caused by an abrupt change in temperature, such that the resist experiences a thermal shock. The thermal shock may be delivered by any of the previously described means.

In one embodiment, two condensate resists are utilized for film patterning. The two resists are chosen to possess thermal expansion coefficients that differ by at least 5%. By employing two condensate resists, pattern transfer may be improved as when the combination of thermal shock and differential thermal expansion shears the resist film from the underlying substrate.

Substrate pre-cooling, resist condensation, resist compression, resist patterning, film deposition, and resist lift-off may occur in distinct processing chambers, where the temperature and environment may be independently controlled. Alternatively, one or more of the preceding process steps may occur in the same chamber, such that total film patterning process throughput is increased. The film patterning process may be employed one or more times, and may take place in the same or a different set of chambers. Each chamber may be separated by one or more doors, load locks, gates, partitions, slit seals, or any combination and connected by a substrate transfer system such as conveyor belts or rollers. The substrate may be supported directly on components that additionally provide substrate temperature control. The substrate may be supported by any convenient means, such as magnetic bearings or lateral force.

Substrate temperature may be monitored during any and all process steps through the use of any convenient and suitable means, including infrared machine vision, infrared sensors, and thermocouples.

During thin film deposition, it is common for source material utilization efficiency to be less than one hundred percent. Source material which is not transferred to the substrate may be deposited on the inside of the deposition chamber walls. This material may grow in thickness over the course of many substrate coatings and may eventually start to flake off and sourcing particulates and dust, which may reduce functional device yield. As such, the chamber must be cleaned periodically which has the undesirable effect of reducing machine uptime. In one embodiment of the invention, the deposition chamber is also coated with condensate resist material and cooled to maintain resist integrity. The source material lost to the inner chamber walls will thus be deposited on the condensate resist. Periodically, the chamber may be heated such that the resist is lifted off, providing a convenient means to clean the inner chamber walls of the lost source material. This process had the benefit of reducing the cleaning process time and thus increasing machine uptime.

Resist that sublimes from the substrate may have a tendency to redeposit on the substrate surface thereby obscuring features or film quality. A large surface area, cryogenically cooled surface near the substrate such as a coldhead, shield or fin may be provided to collect resist that otherwise would have been redeposited on the substrate.

FIGS. 10-13 show the results of experiments utilizing sublimable carbon dioxide masks. These figures illustrate the efficacy of the invention disclosed herein.

What is claimed is:

1. Method for making a patterned thin film of an organic semiconductor for use in an electrical device structure comprising:
    condensing a resist gas into a solid film onto a substrate selected from the group consisting of glass, metal foil, polymer foil or ceramic cooled to a temperature below the condensation point of the resist gas;
    compressing the resist subsequent to condensation by application of force to achieve a selected density;
    selectively heating by laser light, resistive heating or by thermal contact with raised features on a stamp the condensed solid film to cause local direct sublimation from solid to vapor of selected portions of the solid film thereby creating a patterned resist film with feature dimensions of five micrometers or larger;
    coating an organic semiconductor film on the patterned resist film; and
    heating the patterned resist film to cause it to sublime away and to lift off because of the phase change.

2. Method for making a patterned organic film that can be used in a light-emitting diode (OLED) comprising:
    condensing a resist gas into a solid film onto a substrate cooled to a temperature below the condensation point of the resist gas;
    compressing the resist subsequent to condensation by application of force to achieve a selected density;
    selectively heating by laser light, resistive heating or by thermal contact with raised features on a stamp the condensed solid film to cause local direct sublimation from solid to vapor of selected portions of the solid film thereby creating a patterned resist film with feature dimensions of five micrometers or larger;
    coating an organic film that can be part of a light-emitting diode on the patterned resist film; and
    heating the patterned resist film to cause it to sublime away and to lift off because of the phase change.

3. The method of claim 1 or claim 2 wherein the resist gas is selected from the group consisting of carbon dioxide, nitrous oxide, argon, xenon, hydrogen chloride, acetylene, hexafluoroethane, butane, ethanol, ammonia, sulfur dioxide, isobutane, ethylene, chloroform, formic acid, iodine, and uranium hexafluoride.

4. The method of claim 1 or claim 2 wherein condensation rate is monitored.

5. The method of claim 1 or claim 2 wherein heating the condensed solid film is achieved by joule heating of resistive elements.

6. The method of claim 1 or claim 2 wherein heating is achieved by optical patterning.

7. The method of claim 1 or claim 2 wherein the resist gas is carbon dioxide and is patterned by a laser operating at 225, 2700 or 4300 nanometers.

8. The method of claim 1 or claim 2 further including an optically dense guest material doped into the resist film during condensation.

9. The method of claim 1 or claim 2 wherein resist patterning is performed in vacuo or in an inert gas or gases.

10. The method of claim 1 or claim 2 used for making OLED materials.

11. The method of claim 1 or claim 2 wherein resist lift-off is effected by increasing the temperature of the condensate resist across its sublimation point in pressure-temperature space.

12. The method of claim 1 or claim 2 wherein the lift-off is effected by a thermal shock.

13. The method of claim 1 or claim 2 wherein two condensate resist gases are used for film patterning, the thermal expansion coefficients of the two gases differing by at least 5%.

14. The method of claim 1 or claim 2 wherein the substrate is cooled to a temperature below the condensation point of the resist gas.

15. The method of claim 4 wherein the substrate is cooled by thermal conduction.

16. The method of claim 1 wherein the heating is achieved with a patterned stamp such as a roller.

17. The method of claim 16 wherein the stamp is patterned by chemical etching, mechanical scribing or direct laser ablation.

\* \* \* \* \*